United States Patent
Tu et al.

(10) Patent No.: US 9,330,901 B2
(45) Date of Patent: May 3, 2016

(54) NITROGEN-CONTAINING OXIDE FILM AND METHOD OF FORMING THE SAME

(71) Applicant: Taiwan Semiconductor Manufacturing Company, Ltd., Hsin-Chu (TW)

(72) Inventors: An-Chun Tu, Taipei (TW); Chih-Hong Hwang, New Taipei (TW); Yi Hsien Lu, Yuanchang Township (TW); Chun-Heng Chen, Hsin-Chu (TW); Chen-Chien Li, Hsin-Chu (TW); Chih-Jen Wu, Chu-Dong Town (TW); Kuei-Shu Chang-Liao, Hsin-Chu (TW); Chen-Ming Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/782,382

(22) Filed: Mar. 1, 2013

(65) Prior Publication Data

US 2014/0246758 A1    Sep. 4, 2014

(51) Int. Cl.
*H01L 21/02* (2006.01)
*H01L 21/28* (2006.01)
*H01L 29/51* (2006.01)

(52) U.S. Cl.
CPC ...... *H01L 21/02178* (2013.01); *H01L 21/0228* (2013.01); *H01L 21/02181* (2013.01); *H01L 21/02247* (2013.01); *H01L 21/02249* (2013.01); *H01L 21/02274* (2013.01); *H01L 21/28202* (2013.01); *H01L 29/518* (2013.01)

(58) Field of Classification Search
CPC ............... H01L 21/02247; H01L 21/02249; H01L 21/028202
USPC .................................... 438/775, 769
See application file for complete search history.

(56) References Cited

U.S. PATENT DOCUMENTS

| | | | |
|---|---|---|---|
| 6,960,537 B2 * | 11/2005 | Shero et al. | 438/775 |
| 2004/0266217 A1 | 12/2004 | Kim et al. | |
| 2006/0189055 A1 | 8/2006 | Park et al. | |
| 2008/0194091 A1 * | 8/2008 | Lin et al. | 438/591 |
| 2010/0323529 A1 * | 12/2010 | Honda et al. | 438/777 |
| 2011/0027979 A1 | 2/2011 | Seino et al. | |

FOREIGN PATENT DOCUMENTS

| | | |
|---|---|---|
| JP | 2011029478 | 2/2011 |
| KR | 1020000035980 | 6/2000 |
| KR | 1020050005726 | 1/2005 |
| KR | 100584783 | 5/2006 |
| WO | 9810464 | 3/1998 |

* cited by examiner

*Primary Examiner* — Phat X Cao
(74) *Attorney, Agent, or Firm* — Slater & Matsil, L.L.P.

(57) ABSTRACT

A method of forming a nitrogen-containing oxide film is disclosed. The method comprises (a) exposing a substrate to a first gas pulse having one of an oxygen-containing gas and a metal-containing gas; (b) exposing the substrate to a second gas pulse having the other of the oxygen-containing gas and the metal-containing gas to form an oxide film over the substrate; and (c) exposing the oxide film to a third gas pulse having a nitrogen-containing plasma to form a nitrogen-containing oxide film, wherein the nitrogen-containing oxide film has a nitrogen concentration between about 0.1 and about 3 atomic percent (at %).

20 Claims, 5 Drawing Sheets

NITROGEN-CONTAINING OXIDE FILM AND METHOD OF FORMING THE SAME

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component that can be created using a fabrication process) has decreased. With decreasing feature sizes, quantum mechanical tunneling ("tunneling") leads to leakage current, i.e., current leaking out of device features (e.g., across gate oxides), which adversely affects device performance. For this reason, a thin $SiO_2$ film, which is traditionally used as a gate oxide in metal-oxide-semiconductor field effect transistors (MOSFETs), can no longer function as an effective gate dielectric. Thus, an ultra-thin dielectric film with a high dielectric constant ("high-k dielectric") is desirable.

To form a thin dielectric film on a substrate, a variety of deposition techniques have been developed. For example, chemical vapor deposition (CVD) has traditionally been used to form a high-k film on a substrate. In gate dielectric applications, electrically active defects should be minimized or prevented from forming at the interface between a substrate and a high-k dielectric. Thus, plasma treatment after CVD has been widely developed for enhancement of interface quality between a high-k film and a substrate. The uniformity of a high-k film on a substrate should be considered in addition. Hence, another method known as atomic layer deposition (ALD) has been developed for depositing a high-k film onto a substrate. However, further developments for forming high-k dielectrics are still needed to solve some problems of prior approaches.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present invention relates generally to the field of forming dielectric films for semiconductor manufacturing, and more particularly to methods of forming high-k films by atomic layer deposition (ALD) or chemical vapor deposition (CVD).

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

There is a need for new methods that provide flexibility for depositing dielectric films with tailored material and electrical properties for advanced semiconductor devices. ALD can be used to deposit a wide variety of high-k materials such as oxides, silicates, and oxynitrides for fabrication of advanced ICs. A high-k material deposited by ALD can be used as a gate dielectric film in MOSFETs. ALD is a self-limiting (the amount of film material deposited in each reaction cycle is constant), sequential surface chemistry that deposits conformal thin films of materials onto substrates of varying compositions. Due to the characteristics of self-limiting and surface reactions, ALD film growth makes atomic scale deposition control possible. ALD is similar in chemistry to chemical vapor deposition (CVD), except that the ALD reaction breaks the CVD reaction into two half-reactions, keeping the precursor materials separate during the reaction. By keeping the precursors separate throughout the coating process, atomic layer control of film growth can be obtained as fine as 1 angstrom (Å) per cycle. Separation of the precursors is accomplished by pulsing a purge gas (typically nitrogen or argon) after each precursor pulse to remove excess precursor from the process chamber and prevent 'parasitic' deposition on the substrate.

Figure 1:
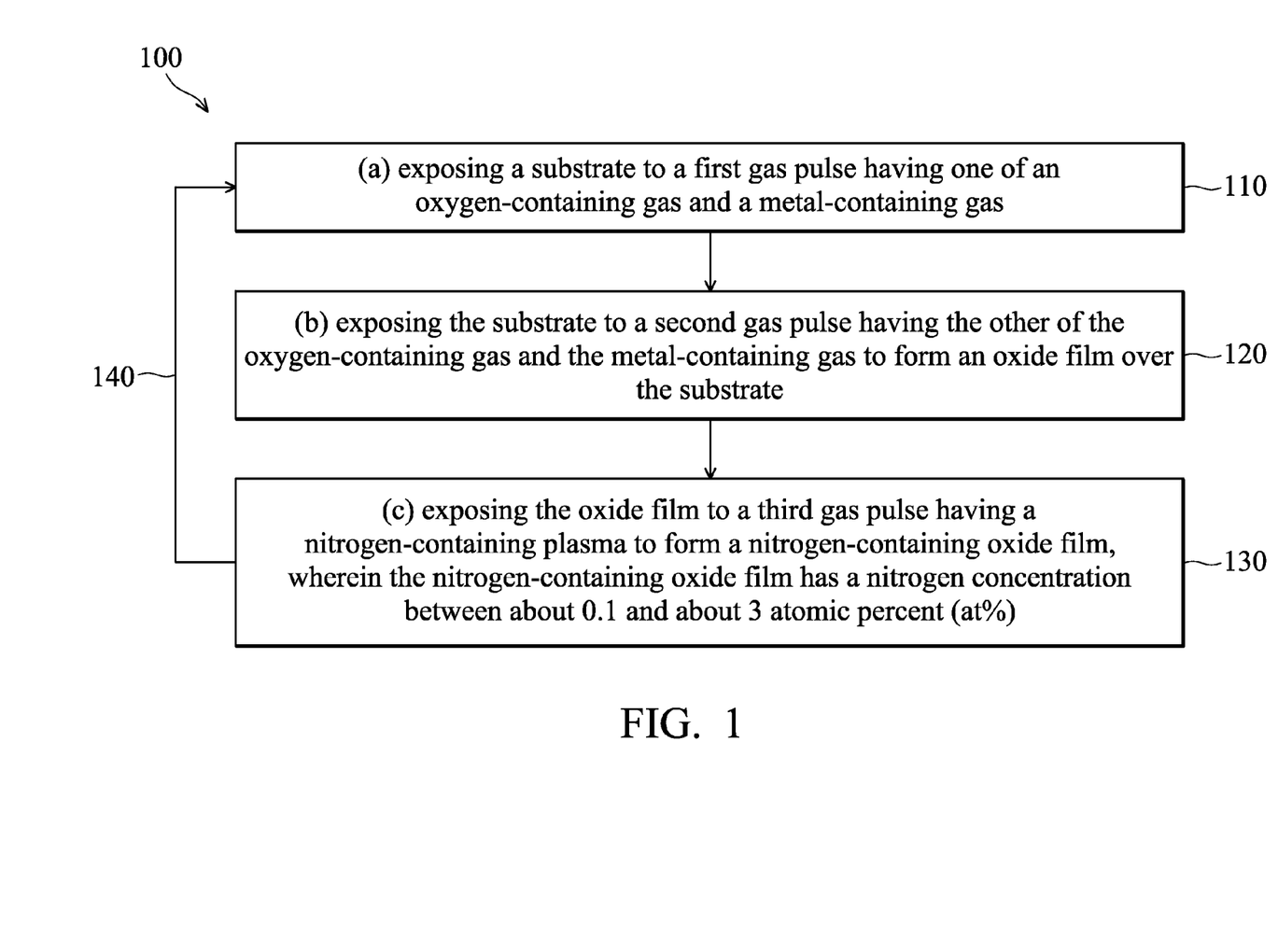
FIG. 1 is a process flow chart of a method 100 of forming a nitrogen-containing oxide film according to various aspects of the present disclosure.

FIG. 1 is a process flow chart of a method 100 of forming a nitrogen-containing oxide film according to various aspects of the present disclosure. It is understood that additional steps can be provided before, during, and after the method 100, and some of the steps described can be replaced or eliminated for other embodiments of the method 100. The method 100 begins at step 110 in which a substrate is exposed to a first gas pulse having one of an oxygen-containing gas and a metal-containing gas. The method 100 continues with step 120 in which the substrate is exposed to a second gas pulse having the other of the oxygen-containing gas and the metal-containing gas to form an oxide film over the substrate. The method 100 continues with step 130 in which the oxide film is exposed to a third gas pulse having a nitrogen-containing plasma to form a nitrogen-containing oxide film, wherein the nitrogen-containing oxide film has a nitrogen concentration between about 0.1 and about 3 atomic percent (at %). It should be recognized here that the term nitrogen-containing plasma, as used herein, is intended to include nitrogen radicals, such as may be produced using a remote plasma process. The method 100 may further continue with annealing the nitrogen-containing oxide film. Steps 110, 120, and 130 may be repeated any number of times, as shown by step 140, to form the nitrogen-containing oxide film with a predetermined thickness. For example, the predetermined thickness can be between about 5 angstrom (Å) and about 200 angstrom (Å), or between about 5 angstrom (Å) and about 30 angstrom (Å). The substrate may be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate may be a semiconductor on insulator (SOI). In some examples, the substrate may include a doped epi layer. In other examples, the substrate may include a multilayer compound semiconductor structure. Alternatively, the substrate may include a non-semiconductor material, such as a glass, fused quartz, or calcium fluoride. In the present example, the substrate comprises silicon. The discussion that follows illustrates embodiments of the nitrogen-containing oxide film that can be formed according to the method 100 of FIG. 1.

Figure 2A:
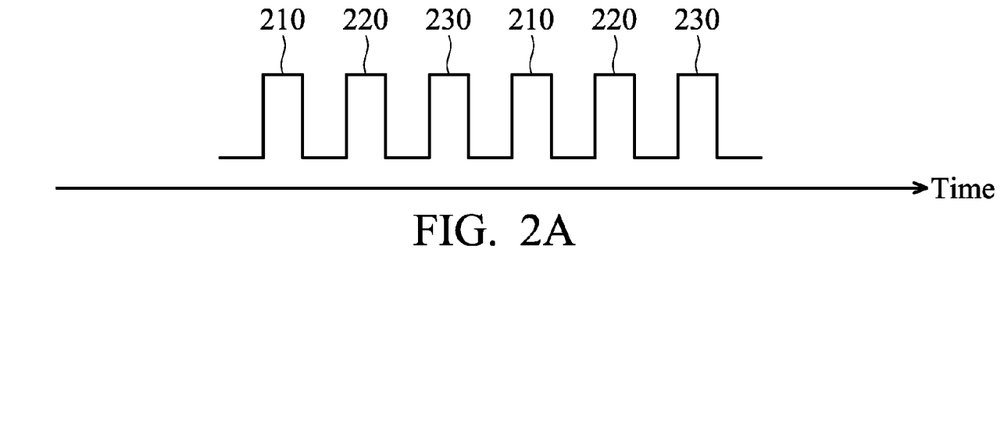
FIG. 2A is a gas flow diagram of the method 100 of forming a nitrogen-containing oxide film according to various aspects of the present disclosure.

FIG. 2A is a gas flow diagram of the method 100 of forming a nitrogen-containing oxide film according to various aspects of the present disclosure. As depicted in FIG. 2A and step 110 in FIG. 1, the method 100 begins at step 110 by exposing a substrate to a first gas pulse 210 having one of an oxygen-containing gas and a metal-containing gas. The oxygen-containing gas comprises water ($H_2O$), hydrogen peroxide ($H_2O_2$), ozone ($O_3$), oxygen gas ($O_2$), oxygen radicals (O), or a combination of two or more thereof. The metal-containing gas comprises one or more metal elements selected from Li, Be, Mg, Ca, Sr, Sc, Y, Ti, Zr, Hf, Al, La, Ce, Pr, Nd, Sm, Eu, Gd, Tb, Dy, Ho, Er, Tm, Yb, and Lu. The metal-containing gas may be a metal halide source chemical. In some embodiments, the metal-containing gas is $MZ_4$, wherein "M" is a metal, such as Ti, Zr, or Hf, and "Z" is selected from the group consisting of F, Cl, Br, I, and At. An example is $HfCl_4$. The metal-containing gas may be an organo-metal compound. In some embodiments, the metal-containing gas is trimethylaluminum, the chemical compound with the formula $Al_2(CH_3)_6$, abbreviated as $Al_2Me_6$, $(AlMe_3)_2$ or the abbreviation TMA. Exemplary pulse time of the first gas pulse 210 can be between 0.005 and 3 sec, for example 0.04 sec.

As depicted in FIG. 2A and step 120 in FIG. 1, the method 100 continues with step 120 by exposing the substrate to a second gas pulse 220 having the other of the oxygen-containing gas and the metal-containing gas to form an oxide film over the substrate. Exemplary pulse time of the second gas pulse 220 can be between 0.005 and 3 sec, for example 0.2 sec.

As depicted in FIG. 2A and step 130 in FIG. 1, the method 100 continues with step 130 by exposing the oxide film to a third gas pulse 230 having a nitrogen-containing plasma to form a nitrogen-containing oxide film, wherein the nitrogen-containing oxide film has a nitrogen concentration between about 0.1 and about 3 at %. The plasma system can, for example, contain a microwave frequency generator. The plasma is a high density plasma formed from a helicon source, a helical-resonator source, electron-cyclotron resonance source, or an inductively coupled source—or it can be a low density plasma, and the nitrogen-containing source is either $N_2$, $NH_3$, NO, or $N_2O$, so the nitrogen-containing plasma comprises $N_2$, $NH_3$, NO, $N_2O$, or a combination of two or more thereof. The plasma system may operate at 100 to 3000 W, at temperatures from 50° C. to 1200° C., and at pressures from 1 milliTorr to 200 milliTorr. The plasma density is around $1 \times 10^{10}$ to $1 \times 10^{12}$ $cm^{-3}$, the nitrogen-containing gas flow is around 1 to 100 standard cubic centimeter per minute (sccm), the substrate (wafer) bias is around 0 to 500 Volts, and the duration of the exposure to the plasma is around 0.005 to 60 seconds. Exemplary pulse time of the third gas pulse 230 can be between 0.005 and 60 sec, for example 20 sec.

The doping of nitrogen can help stabilize a dielectric material with a higher permittivity. However, a high nitrogen concentration may have drawbacks of increasing interface defects (Nit) at an interface of the oxide film and the substrate, causing higher shift of negative bias temperature instability (NBTI), and thus reducing carrier mobility (μ). A nitrogen concentration higher than 4 at % may cause more nitrogen trapped at the interface, which is responsible for NBTI and μ degradations. In some embodiments of the present disclosure, the nitrogen concentration is between about 0.1 and about 3 at %.

Figure 2B:
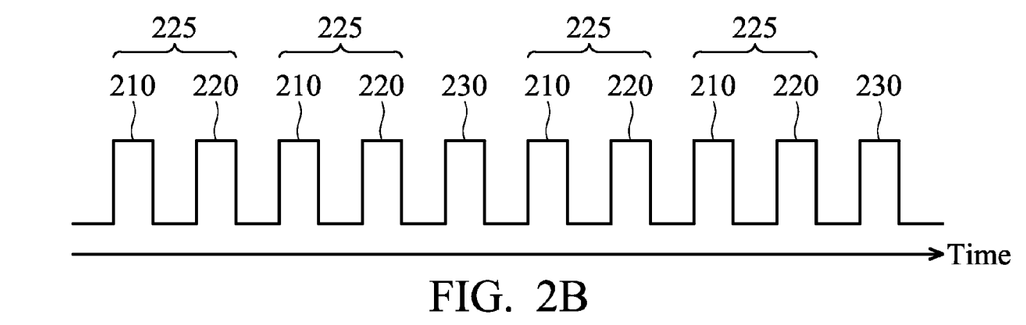
FIG. 2B is another gas flow diagram of the method 100 of forming a nitrogen-containing oxide film according to various aspects of the present disclosure.

FIG. 2B is another gas flow diagram of the method 100 of forming a nitrogen-containing oxide film according to various aspects of the present disclosure. The first gas pulse 210 and the second gas pulse 220 forms a combined gas pulse 225 which may be performed several times (not limited to two times as shown in FIG. 2B) before the third gas pulse 230. In some embodiments, the combined gas pulse 225 is performed about 1 to about 5 times before the third gas pulse 230, i.e., step 110 and step 120 forms a cycle performed about 1 to about 5 times before step 130. In some embodiments, the combined gas pulse 225 is performed about 6 to about 35 times before the third gas pulse 230, i.e., step 110 and step 120 forms a cycle performed about 6 to about 35 times before step 130.

As depicted in FIGS. 2A-2B and steps 110, 120, and 130 in FIG. 1, in some embodiments, a gas flow rate of the first gas pulse 210, a gas flow rate of the second gas pulse 220, and a gas flow rate of the third gas pulse 230 are substantially equal. For example, the gas flow rate is 20 sccm with a carrier gas $N_2$. In some embodiments, a ratio of a pulse time of the third gas pulse 230 to a pulse time of the first gas pulse 210 or the second gas pulse 220 is about 10 to about 1000. In some embodiments, the ratio is about 100 to about 800. For example, the pulse time of the first gas pulse 210 is 0.04 sec, the pulse time of the second gas pulse 220 is 0.2 sec, and the pulse time of the third gas pulse 230 is 20 sec.

As depicted in step 140 in FIG. 1, steps 110, 120, and 130 may be repeated any number of times to form the nitrogen-containing oxide film with a predetermined thickness. For example, the predetermined thickness can be between about 5 angstrom (Å) and about 200 angstrom (Å), or between about 5 angstrom (Å) and about 30 angstrom (Å). In some embodiments, the oxide film is formed over the substrate by atomic layer deposition (ALD) or chemical vapor deposition (CVD). In some embodiments, the nitrogen-containing oxide film is formed over the substrate by atomic layer deposition (ALD) or chemical vapor deposition (CVD). In some embodiments, the nitrogen-containing oxide film has a dielectric constant ranging from about 22 to about 27.

The method 100 further comprises purging and evacuating a chamber in which steps 110, 120, and 130 are performed. The chamber is purged by a purge gas pulse comprising an inert gas, such as nitrogen ($N_2$), helium (He), neon (Ne), argon (Ar), krypton (Kr), xenon (Xe), or radon (Rn), and evacuated to remove unreacted oxygen-containing gas, unreacted metal-containing gas, unreacted nitrogen-containing plasma, and any byproducts from the chamber. The purge gas pulse is performed between each two consecutive gas pulses of the first gas pulse 210, the second gas pulse 220, and the third gas pulse 230. Exemplary purge gas pulses can be between 1 and 20 sec, for example 10 sec. In some embodiments, a pulse time of the purge gas pulse is 15 sec.

The method 100 further comprises annealing the nitrogen-containing oxide film. The annealing may serve multiple purposes. For example, it may be used to eliminate oxygen vacancies or to increase the quality of the nitrogen-containing oxide film. The annealing may also reduce any resulting contamination in the nitrogen-containing oxide film present from the deposition by evaporating or reacting with the annealing environment. For example, many impurities, such as carbon or hydroxyl groups, may be present due to the relatively low temperature deposition of the nitrogen-containing oxide film. Accordingly, a high temperature annealing may reduce these impurities that are present by subjecting them to higher temperatures and removing them from the nitrogen-containing oxide film. As a result, the annealing process may reduce imperfections in the nitrogen-containing oxide film and increase ability to scale to low equivalent oxide thickness (EOT). Alternatively, the annealing may be omitted.

The methods of the present disclosure are not limited to the above-mentioned embodiment, and may have other different embodiments. For making it easier to compare the difference between the embodiments, the following description will detail the dissimilarities among different embodiments and the identical features will not be redundantly described.

Figure 3:
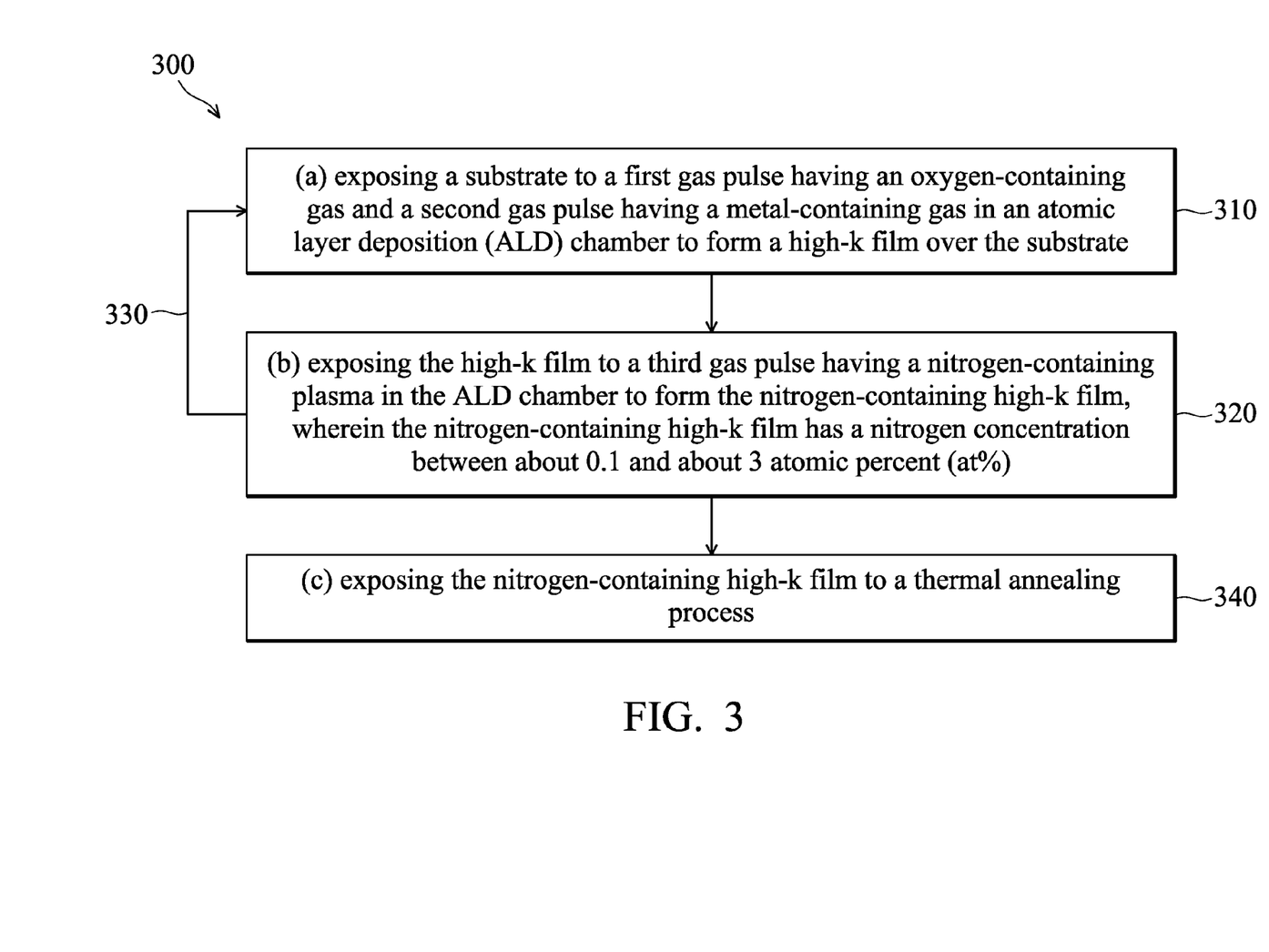
FIG. 3 is a process flow chart of a method 300 of forming a nitrogen-containing high-k film according to various aspects of the present disclosure.

FIG. 3 is a process flow chart of a method 300 of forming a nitrogen-containing high-k film according to various aspects of the present disclosure. It is understood that additional steps can be provided before, during, and after the method 300, and some of the steps described can be replaced or eliminated for other embodiments of the method 300. The method 300 begins at step 310 in which a substrate is exposed to a first gas pulse having an oxygen-containing gas and a second gas pulse having a metal-containing gas in an atomic layer deposition (ALD) chamber to form a high-k film over the substrate. The method 300 continues with step 320 in which the high-k film is exposed to a third gas pulse having a nitrogen-containing plasma in the ALD chamber to form the nitrogen-containing high-k film, wherein the nitrogen-containing high-k film has a nitrogen concentration between about 0.1 and about 3 at %. Steps 310 and 320 may be repeated any number of times, as shown by step 330, to form the nitrogen-containing high-k film with a predetermined thickness. For example, the predetermined thickness can be between about 5 angstrom (Å) and about 200 angstrom (Å), or between about 5 angstrom (Å) and about 30 angstrom (Å). The method 300 continues with step 340 in which the nitrogen-containing high-k film is exposed to a thermal annealing process. The discussion that follows illustrates embodiments of the nitrogen-containing high-k film that can be formed according to the method 300 of FIG. 3.

Figure 4A:
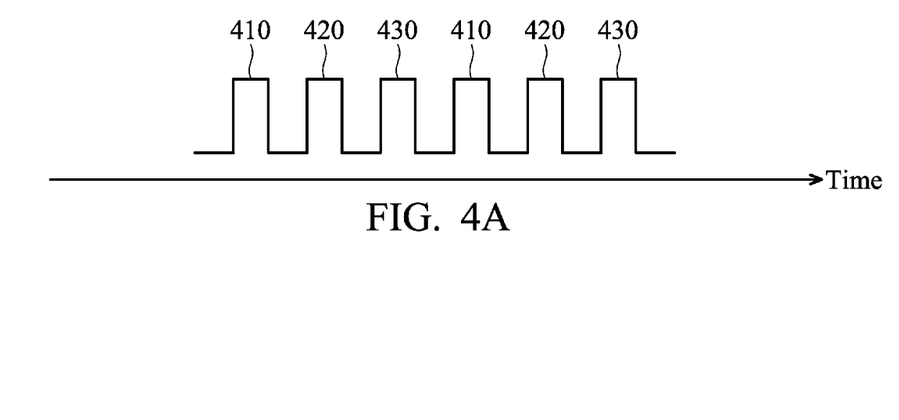
FIG. 4A is a gas flow diagram of the method 300 of forming a nitrogen-containing high-k film according to various aspects of the present disclosure.

FIG. 4A is a gas flow diagram of the method 300 of forming a nitrogen-containing high-k film according to various aspects of the present disclosure. As depicted in FIG. 4A and step 310 in FIG. 3, the method 300 begins at step 310 by exposing a substrate to a first gas pulse 410 having an oxygen-containing gas and a second gas pulse 420 having a metal-containing gas in an atomic layer deposition (ALD) chamber to form a high-k film over the substrate. The oxygen-containing gas comprises water ($H_2O$), hydrogen peroxide ($H_2O_2$), ozone ($O_3$), oxygen gas ($O_2$), oxygen radicals (O), or a combination of two or more thereof. The metal-containing gas comprises one or more metal elements selected from Li, Be, Mg, Ca, Sr, Sc, Y, Ti, Zr, Hf, Al, La, Ce, Pr, Nd, Sm, Eu, Gd, Tb, Dy, Ho, Er, Tm, Yb, and Lu. The metal-containing gas may be a metal halide source chemical. Exemplary pulse time of the first gas pulse 410 can be between 0.005 and 3 sec, for example 0.04 sec. Exemplary pulse time of the second gas pulse 420 can be between 0.005 and 3 sec, for example 0.2 sec.

As depicted in FIG. 4A and step 320 in FIG. 3, the method 300 continues with step 320 by exposing the high-k film to a third gas pulse 430 having a nitrogen-containing plasma in the ALD chamber to form the nitrogen-containing high-k film, wherein the nitrogen-containing high-k film has a nitrogen concentration between about 0.1 and about 3 at %. The nitrogen-containing plasma comprises $N_2$, $NH_3$, NO, $N_2O$, or a combination of two or more thereof. Exemplary pulse time of the third gas pulse 430 can be between 0.005 and 60 sec, for example 20 sec.

As depicted in step 330 in FIG. 3, steps 310 and 320 may be repeated any number of times to form the nitrogen-containing high-k film with a predetermined thickness. For example, the predetermined thickness can be between about 5 angstrom (Å) and about 200 angstrom (Å), or between about 5 angstrom (Å) and about 30 angstrom (Å). In some embodiments, the nitrogen-containing high-k film has a dielectric constant ranging from about 22 to about 27.

As depicted in FIG. 4A and step 340 in FIG. 3, the method 300 continues with annealing the nitrogen-containing high-k film. The annealing may serve multiple purposes. For example, it may be used to eliminate oxygen vacancies or to increase the quality of the nitrogen-containing high-k film. The annealing may also reduce any resulting contamination in the nitrogen-containing high-k film present from the deposition by evaporating or reacting with the annealing environment. For example, many impurities, such as carbon or hydroxyl groups, may be present due to the relatively low temperature deposition of the nitrogen-containing high-k film. Accordingly, a high temperature annealing may reduce these impurities that are present by subjecting them to higher temperatures and removing them from the nitrogen-containing high-k film. As a result, the annealing process may reduce imperfections in the nitrogen-containing high-k film and increase ability to scale to low equivalent oxide thickness (EOT).

Figure 4B:
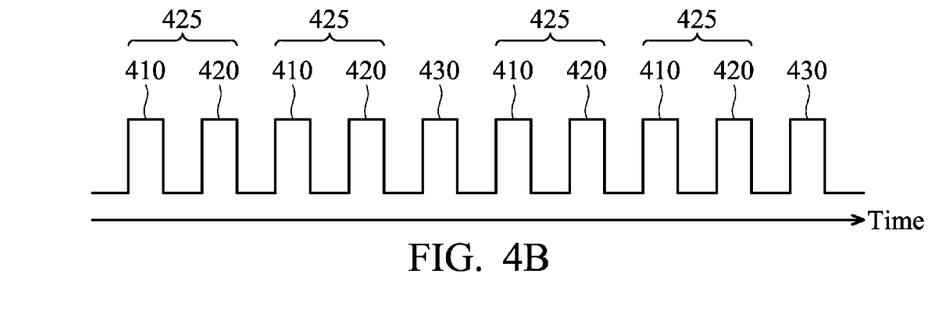
FIG. 4B is another gas flow diagram of the method 300 of forming a nitrogen-containing high-k film according to various aspects of the present disclosure.

FIG. 4B is another gas flow diagram of the method 300 of forming a nitrogen-containing high-k film according to various aspects of the present disclosure. The first gas pulse 410 and the second gas pulse 420 forms a combined gas pulse 425 which may be performed several times (not limited to two times as shown in FIG. 4B) before the third gas pulse 430. In some embodiments, the combined gas pulse 425 is performed about 1 to about 5 times before the third gas pulse 430, i.e., step 310 is performed about 1 to about 5 times before step 320. In some embodiments, the combined gas pulse 425 is performed about 6 to about 35 times before the third gas pulse 430, i.e., step 310 is performed about 6 to about 35 times before step 320.

As depicted in FIGS. 4A-4B and steps 310 and 320 in FIG. 3, in some embodiments, a gas flow rate of the first gas pulse 410, a gas flow rate of the second gas pulse 420, and a gas flow rate of the third gas pulse 430 are substantially equal. For example, the gas flow rate is 20 sccm with a carrier gas $N_2$. In some embodiments, a ratio of a pulse time of the third gas pulse 430 to a pulse time of the first gas pulse 410 or the second gas pulse 420 is about 10 to about 1000. In some embodiments, the ratio is about 100 to about 800. For example, the pulse time of the first gas pulse 410 is 0.04 sec, the pulse time of the second gas pulse 420 is 0.2 sec, and the pulse time of the third gas pulse 430 is 20 sec.

The method 300 further comprises purging and evacuating a chamber in which steps 310, 320, and 330 are performed. The chamber is purged by a purge gas pulse comprising an inert gas, such as nitrogen ($N_2$), helium (He), neon (Ne), argon (Ar), krypton (Kr), xenon (Xe), or radon (Rn), and evacuated to remove unreacted oxygen-containing gas, unreacted metal-containing gas, unreacted nitrogen-containing plasma, and any byproducts from the chamber. The purge gas pulse is performed between each two consecutive gas pulses of the first gas pulse 410, the second gas pulse 420, and the third gas pulse 430. Exemplary purge gas pulses can be between 1 and 20 sec, for example 10 sec. In some embodiments, a pulse time of the purge gas pulse is 15 sec.

Figure 5:
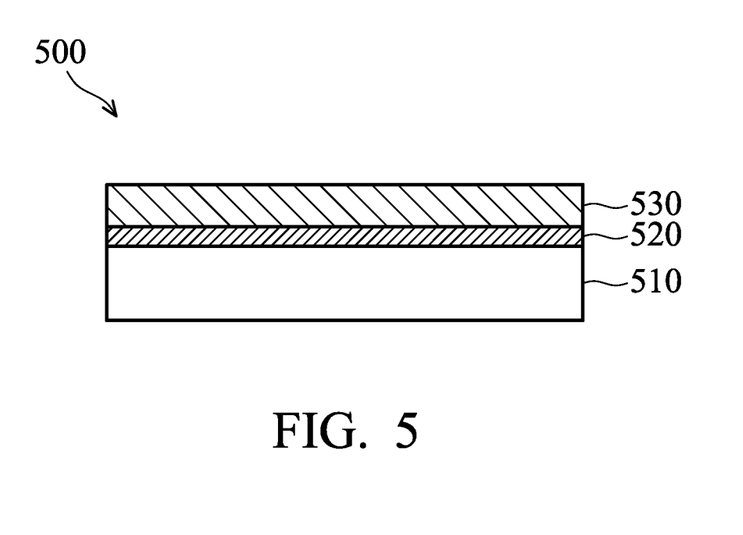
FIG. 5 is a cross-sectional view of a semiconductor device 500 according to various aspects of the present disclosure.

FIG. 5 is a cross-sectional view of a semiconductor device 500 according to various aspects of the present disclosure. As depicted in FIG. 5, the semiconductor device 500 comprises a high-k film 520 over a substrate 510 and a first electrode 530 over the high-k film 520, wherein the high-k film 520 has a nitrogen concentration between about 0.1 and about 3 at %. In some embodiments, the high-k film has a dielectric constant ranging from about 22 to about 27. In some embodiments, the substrate 510 is a second electrode. In some embodiments, the first electrode 530 or the second electrode 510 may comprise a single-layer or multilayer structure. In one embodiment, the first electrode 530 or the second electrode 510 comprises poly-silicon. Further, the first electrode 530 or the second electrode 510 may be doped poly-silicon with the uniform or non-uniform doping. In an alternative embodiment, the first electrode 530 or the second electrode 510 comprises a metal selected from a group of W, Cu, Ti, Ag, Al, TiAl, TiAlN, TaC, TaCN, TaSiN, Mn, and Zr. In an alternative embodiment, the first electrode 530 or the second electrode 510 comprises a metal selected from a group of TiN, WN, TaN, and Ru. In an alternative embodiment, the first electrode 530 or the second electrode 510 has a thickness in a range from about 30 nm to about 60 nm. The first electrode 530 or the second electrode 510 may be formed using a suitable process such as ALD, CVD, PVD, plating, or combinations thereof.

The methods of the present disclosure are not limited to be used by a planar device on the substrate and can be applied to a non-planar device as well, such as a fin-like field effect transistor (FinFET). Based on the discussions above, it can be seen that by using the methods of the present disclosure, the quality of the nitrogen-containing oxide film (or the nitrogen-containing high-k film) is enhanced. For example, a nitrogen concentration higher than 4 at % may cause more nitrogen trapped at an interface of the nitrogen-containing oxide film (or the nitrogen-containing high-k film) and the substrate, which is responsible for NBTI and μ degradations. By controlling the nitrogen concentration between about 0.1 and about 3 at %, NBTI and μ will not degrade seriously. In addition, when EOT decreases, the leakage current of the nitrogen-containing oxide film (or the nitrogen-containing high-k film) does not increase. As a result, the device performance can be well controlled by using the methods of the present disclosure.

One of the broader forms of the present disclosure involves a method. The method comprises (a) exposing a substrate to a first gas pulse having one of an oxygen-containing gas and a metal-containing gas; (b) exposing the substrate to a second gas pulse having the other of the oxygen-containing gas and the metal-containing gas to form an oxide film over the substrate; and (c) exposing the oxide film to a third gas pulse having a nitrogen-containing plasma to form a nitrogen-containing oxide film, wherein the nitrogen-containing oxide film has a nitrogen concentration between about 0.1 and about 3 atomic percent (at %).

In some embodiments, the method further comprises annealing the nitrogen-containing oxide film.

In some embodiments, step (a) and step (b) forms a cycle performed about 1 to about 5 times before step (c).

In some embodiments, step (a) and step (b) forms a cycle performed about 6 to about 35 times before step (c).

In some embodiments, the oxygen-containing gas comprises water ($H_2O$), hydrogen peroxide ($H_2O_2$), ozone ($O_3$), oxygen gas ($O_2$), oxygen radicals (O), or a combination of two or more thereof.

In some embodiments, the metal-containing gas comprises one or more metal elements selected from Li, Be, Mg, Ca, Sr, Sc, Y, Ti, Zr, Hf, Al, La, Ce, Pr, Nd, Sm, Eu, Gd, Tb, Dy, Ho, Er, Tm, Yb, and Lu.

In some embodiments, the nitrogen-containing plasma comprises $N_2$, $NH_3$, NO, $N_2O$, or a combination of two or more thereof.

In some embodiments, a gas flow rate of the first gas pulse, a gas flow rate of the second gas pulse, and a gas flow rate of the third gas pulse are substantially equal.

In some embodiments, a ratio of a pulse time of the third gas pulse to a pulse time of the first gas pulse or the second gas pulse is about 10 to about 1000.

In some embodiments, the oxide film is formed over the substrate by atomic layer deposition (ALD) or chemical vapor deposition (CVD).

In some embodiments, the nitrogen-containing oxide film is formed over the substrate by atomic layer deposition (ALD) or chemical vapor deposition (CVD).

Another of the broader forms of the present disclosure involves a method of forming a nitrogen-containing high-k film. The method comprises (a) exposing a substrate to a first gas pulse having an oxygen-containing gas and a second gas pulse having a metal-containing gas in an atomic layer deposition (ALD) chamber to form a high-k film over the substrate; (b) exposing the high-k film to a third gas pulse having a nitrogen-containing plasma in the ALD chamber to form the nitrogen-containing high-k film, wherein the nitrogen-containing high-k film has a nitrogen concentration between about 0.1 and about 3 atomic percent (at %); and (c) exposing the nitrogen-containing high-k film to a thermal annealing process.

In some embodiments, step (a) is performed about 1 to about 5 times before step (b).

In some embodiments, step (a) is performed about 6 to about 35 times before step (b).

In some embodiments, the oxygen-containing gas comprises water ($H_2O$), hydrogen peroxide ($H_2O_2$), ozone ($O_3$), oxygen gas ($O_2$), oxygen radicals (O), or a combination of two or more thereof.

In some embodiments, the metal-containing gas comprises one or more metal elements selected from Li, Be, Mg, Ca, Sr, Sc, Y, Ti, Zr, Hf, Al, La, Ce, Pr, Nd, Sm, Eu, Gd, Tb, Dy, Ho, Er, Tm, Yb, and Lu.

In some embodiments, the nitrogen-containing plasma comprises $N_2$, $NH_3$, NO, $N_2O$, or a combination of two or more thereof.

Still another of the broader forms of the present disclosure involves a semiconductor device. The semiconductor device comprises a high-k film over a substrate, wherein the high-k film has a nitrogen concentration between about 0.1 and about 3 atomic percent (at %); and a first electrode over the high-k film.

In some embodiments, the high-k film has a dielectric constant ranging from about 22 to about 27.

In some embodiments, the substrate is a second electrode.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   (a) exposing a substrate to a first gas pulse having one of an oxygen-containing gas and a metal-containing gas;
   (b) exposing the substrate to a second gas pulse having the other of the oxygen-containing gas and the metal-containing gas to form an oxide film over the substrate;
   (c) exposing the oxide film to a third gas pulse having a nitrogen-containing plasma to form a nitrogen-containing oxide film, wherein a gas flow rate of the first gas pulse, a gas flow rate of the second gas pulse, and a gas flow rate of the third gas pulse are substantially equal, and wherein the nitrogen-containing oxide film has a nitrogen concentration between about 0.1 and about 3 atomic percent (at %); and
   annealing the nitrogen-containing oxide film.

2. The method of claim 1, wherein step (a) and step (b) forms a cycle performed about 1 to about 5 times before step (c).

3. The method of claim 1, wherein step (a) and step (b) forms a cycle performed about 6 to about 35 times before step (c).

4. The method of claim 1, wherein the oxygen-containing gas comprises water ($H_2O$), hydrogen peroxide ($H_2O_2$), ozone ($O_3$), oxygen gas ($O_2$), oxygen radicals (O), or a combination of two or more thereof.

5. The method of claim 1, wherein the metal-containing gas comprises one or more metal elements selected from Li, Be, Mg, Ca, Sr, Sc, Y, Ti, Zr, Hf, Al, La, Ce, Pr, Nd, Sm, Eu, Gd, Tb, Dy, Ho, Er, Tm, Yb, and Lu.

6. The method of claim 1, wherein the nitrogen-containing plasma comprises $N_2$, $NH_3$, NO, $N_2O$, or a combination of two or more thereof.

7. The method of claim 1, wherein a ratio of a pulse time of the third gas pulse to a pulse time of the first gas pulse or the second gas pulse is about 10 to about 1000.

8. The method of claim 1, wherein the oxide film is formed over the substrate by atomic layer deposition (ALD) or chemical vapor deposition (CVD).

9. The method of claim 1, wherein the nitrogen-containing oxide film is formed over the substrate by atomic layer deposition (ALD) or chemical vapor deposition (CVD).

10. The method of claim 1, wherein a ratio of a pulse time of the third gas pulse to a pulse time of the first gas pulse remains constant throughout the method.

11. A method of forming a nitrogen-containing high-k film, comprising:
    (a) exposing a substrate to a first gas pulse having an oxygen-containing gas and a second gas pulse having a metal-containing gas in an atomic layer deposition (ALD) chamber to form a high-k film over the substrate;
    (b) exposing the high-k film to a third gas pulse having a nitrogen-containing plasma in the ALD chamber to form the nitrogen-containing high-k film, wherein a gas flow rate of the second gas pulse and a gas flow rate of the third gas pulse are substantially equal, and wherein the nitrogen-containing high-k film has a nitrogen concentration between about 0.1 and about 3 atomic percent (at %); and
    (c) exposing the nitrogen-containing high-k film to a thermal annealing process.

12. The method of claim 11, wherein step (a) is performed about 1 to about 5 times before step (b).

13. The method of claim 11, wherein step (a) is performed about 6 to about 35 times before step (b).

14. The method of claim 11, wherein the oxygen-containing gas comprises water ($H_2O$), hydrogen peroxide ($H_2O_2$), ozone ($O_3$), oxygen gas ($O_2$), oxygen radicals (O), or a combination of two or more thereof.

15. The method of claim 11, wherein the metal-containing gas comprises one or more metal elements selected from Li, Be, Mg, Ca, Sr, Sc, Y, Ti, Zr, Hf, Al, La, Ce, Pr, Nd, Sm, Eu, Gd, Tb, Dy, Ho, Er, Tm, Yb, and Lu.

16. The method of claim 11, wherein the nitrogen-containing plasma comprises $N_2$, $NH_3$, NO, $N_2O$, or a combination of two or more thereof.

17. A method comprising:
    forming over a substrate a high-k film, by
      (a) exposing the substrate to first gas pulse having a first gas selected from the group consisting of an oxygen-containing gas and a metal-containing gas;
      (b) exposing the substrate to a second gas pulse having a second gas selected from the group consisting of an oxygen-containing gas and a metal-containing gas, wherein the second gas is not the same gas as the first gas, to form an oxide film, wherein the substrate is exposed to at most a purge gas pulse between the first gas pulse and the second gas pulse;
      (c) exposing the oxide film to a third gas pulse having a nitrogen-containing plasma to form a nitrogen-containing oxide film, wherein the third gas pulse does not overlap with the first gas pulse and the second gas pulse, wherein a gas flow rate of the first gas pulse, a gas flow rate of the second gas pulse, and a gas flow rate of the third gas pulse are substantially equal, and wherein the nitrogen-containing oxide film has a nitrogen concentration between about 0.1 and about 3 atomic percent (at %); and (d) exposing the nitrogen-containing oxide film to a thermal anneal; and forming over the high-k film an electrode layer.

18. The method of claim 17, wherein steps (a) and (b) are repeated between 1 and 35 times before step (c) is performed.

19. The method of claim 17, wherein steps (a), (b), and (c) are performed a plurality of times before forming the electrode layer.

20. The method of claim 17, wherein a pulse time of the first gas pulse is between about 0.005 sec and about 3 sec, wherein a pulse time of the second gas pulse is between about 0.005 sec and about 3 sec, and wherein a pulse time of the third gas pulse is between about 0.005 sec and about 60 sec.

* * * * *